United States Patent [19]

Temple

[11] Patent Number: 5,497,013

[45] Date of Patent: Mar. 5, 1996

[54] SEMI-CONDUCTOR CHIP HAVING INTERDIGITATED GATE RUNNERS WITH GATE BONDING PADS

[75] Inventor: Victor A. K. Temple, Clifton, N.Y.

[73] Assignee: Harris Corporation, Melbourne, Fla.

[21] Appl. No.: 276,464

[22] Filed: Jul. 18, 1994

Related U.S. Application Data

[62] Division of Ser. No. 51,832, Apr. 26, 1993, Pat. No. 5,366,932.

[51] Int. Cl.$^6$ .......................... H01L 23/48; H01L 29/44; H01L 29/52; H01L 29/60
[52] U.S. Cl. .......................... 257/203; 257/207; 257/208; 257/704
[58] Field of Search .......................... 257/704, 203, 257/207, 208, 211

[56] References Cited

U.S. PATENT DOCUMENTS 5,162,893  11/1992  Okano ........................... 257/203
5,258,647  11/1993  Wojnarowski ................. 257/704

Primary Examiner—William Mintel
Assistant Examiner—Roy Potter
Attorney, Agent, or Firm—Rogers & Killeen

[57] ABSTRACT

A semiconductor chip having a cellular topography and a method of packaging a cellular semiconductor chip, includes plural interdigitated metal gate runners that overlie and contact selected gate electrodes on the chip surface, each of the gate runners having an integral widened area to enable a package-carried gate electrode contact foil to be bonded thereto. The gate runner widened areas are relatively small and have little impact on chip active area. The plural gate runners have portions that underlie a package-carried power electrode contact foil and that are separated therefrom by a nonbondable, insulating layer. The gate runners may be deposited on the chip in the same step and from the name material am the power electrode. The portion of the power electrode on the chip surface that underlies the package-carried gate electrode contact foil is separated therefrom and available for use as active area of the chip, Package lid-to-chip alignment tolerances may be relaxed as they are not dictated by alignment of the lid-carried gate contact foil with the gate electrode on the chip.

12 Claims, 3 Drawing Sheets

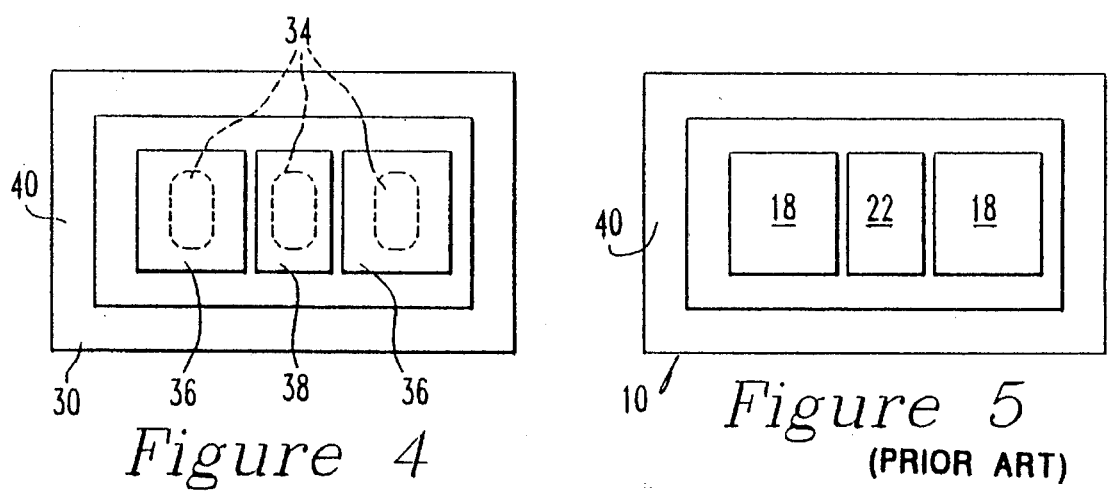
Figure 4 (PRIOR ART)
Figure 5 (PRIOR ART)
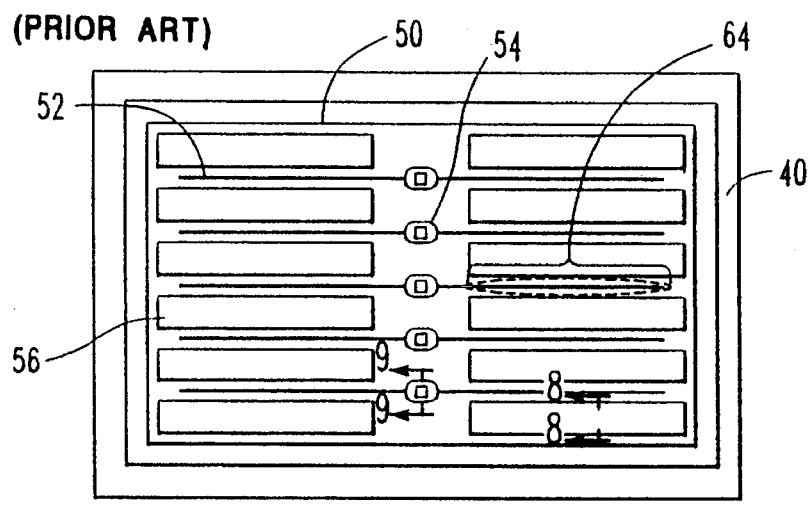
Figure 6
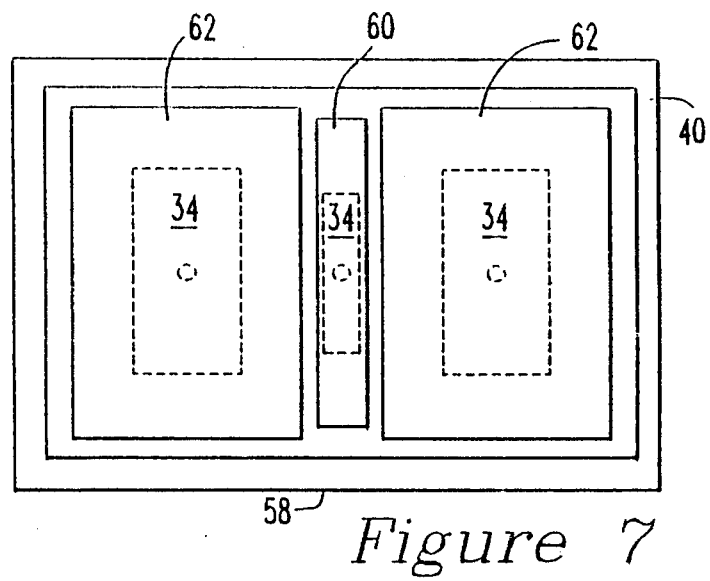
Figure 7

SEMI-CONDUCTOR CHIP HAVING INTERDIGITATED GATE RUNNERS WITH GATE BONDING PADS

This a division of application Ser. No. 051,832 filed Apr. 26, 1993, now U.S. Pat. No. 5,366,932. This application is related to application Ser. No. 823,343, now U.S. Pat. No. 5,248,901 filed Jan. 21, 1992 and to application Ser. No. 826,003, filed Jan. 27, 1992, now abandoned, that are owned by the owner of this application and are incorporated herein by reference.

BACKGROUND OF THE INVENTION

The present invention relates to methods of packaging semiconductor chips and packaged semiconductor chips, and more particularly to packaging methods and chips in which the package lid-to-chip alignment tolerances are not dictated by the alignment of the lid-carried gate contacts with the chip gate electrodes.

Packages for semiconductor chips protect time chip from the environment in which the chip is to be used and provide access to time electrical contacts that are found on the chip. Packages are available in a wide variety of configurations, some of which are hermetic (gas-tight), and the design thereof must consider the need to dissipate heat generated by the chip, the current and voltage carrying capacity of time chip and the surface topography of the chip. A goal is to provide ever smaller and lighter chip packages that can be manufactured without undue cost or complexity. Although it is known to change chip topography to accommodate packaging, the methods of doing so typically add layers on top of existing chip topography and thus increase the complexity of the chip and the chip manufacturing process. The present invention is a departure from known practices in that the chip is designed to accommodate packaging needs in a manner that benefits chip performance without increasing chip manufacturing complexity.

Semiconductor chips for which the present invention may find application include solid state power devices having a cellular topography, such as, but not limited to, MOSFETs, MOS gated semiconductor devices, including MOS controlled thyristors (MCTs), insulated gate bipolar transistors (IGBTs), conductivity modulated field effect transistors (COMFETs) and the like. By way of example, a chip 10 having a cellular topography may be seen in FIG. 1. Such chips are manufactured using known processes, such as the vertical double-diffused process called DMOS. Each chip may include tens of thousands of uniformly spaced cells 12 spaced 10 to 50 microns center to center (e.g., a 240 mil$^2$ chip may have more than 250,000 cells.) Typically, two electrodes are located on the upper surface of the chip: a polysilicon gate electrode 14 in the spaces 16 between the cells 12 and a metal power electrode 18 that overlies all of the cells, including the intercellular spaces 16 covered by the gate electrode 14. The two electrodes are separated by an insulative layer 20. The source electrode 18 is on a top layer of the chip 10 and is exposed so that electrical contact may be made therewith. However, the gate electrode 14 underlies the source electrode 18 making contact therewith more difficult.

As shown in FIG. 1, one known method of electrically contacting the gate electrode 14 is to provide an additional metal layer to form a metal gate electrode bonding area 22 where electrical contact may be made, with the size of the gate bonding area generally determined by the nature of the bonding method used to connect a source of gate voltage thereto. However, this method increases manufacturing complexity of the chip and reduces the area of the chip which can be dedicated to cells (the active area) by the area of the metal gate bonding area 22 and its associated metal gate runners 24 that carry a gate signal throughout the chip. Because of their composition and cross-section, metal gate runners 24 carry a gate signal from the gate bonding area 22 to areas of the gate electrode 14 remote therefrom with fewer impedance losses than would be found if only the polysilicon gate electrode 14 itself were used to carry the gate signal.

The rate at which gate electrode voltage is carried over the surface of the chip is affected by a number of factors, including the speed of the driver circuit delivering the gate signal, parasitic package inductance, inherent gate capacitance, and the effective series resistance (ESR) of the polysilicon gate electrode. The ESR is also related to a number of factors, including the geometry of the polysilicon gate electrode and the resistance of the polysilicon. Interdigitated (i.e., between cell) metal gate runners have been used to reduce ESR. The metal gate runners are connected to the gate bonding area and may be carried on top of the source electrode (separated therefrom by a dielectric material) without reducing chip active area.

Examples of packaging for a cellular semiconductor chip may be seen in FIGS. 2 and 3 where the package 26 and chip 10 are in vertical cross-section with reference to FIG. 2 (described in related application Ser. No. 823,343), the package may include a tub 28 for holding the chip 10 and a lid 30 for protecting the upper surface 32 of the chip (and for sealing the chip 10 inside the package 26 when the package is hermetic). The tub 28 may comprise several pieces as shown in FIG. 2 or be formed from a single piece of appropriate material. As shown in FIG. 3 (described in related application Ser. No. 826,003), the upper surface of the chip 10 may be protected and/or sealed by placing a lid 30 over the upper surface and attaching the edge of the lid 30 to the edge of the chip 10 to obviate the need for the tub.

Electrical contacts 34 for conducting current to and from the chip 10 extend through the lid 30. As the electrical contacts 34 may be small in cross-sectional area, the area of contact with the chip electrodes 18 and 22 may be enlarged by the use of electrically conductive foils 36 and 38 in contact with the respective chip electrodes 18 and 22.

One of the problems encountered in the packaging process is the alignment of the lid 30 with the chip 10 so that the foils 36 and 38 only contact their associated chip electrodes 18 and For example, prior art package manufacturing processes have alignment tolerances of up to several hundred microns, typically 50 to 150 microns. To accommodate the lid alignment tolerances in the prior art, chip topography was changed to provide additional spacing between electrodes. However, this additional space reduced the amount of active area making the chip less efficient and more costly. This problem is illustrated in FIGS. 4 and 5 where FIG. 4 illustrates the bottom surface of the lid 30 of FIG. 3 and where FIG. 5 shows the top surface of the chip 10 of FIG. 3. As may be seen therein, the foils 36 and 38 on the lid bottom surface are aligned with the electrodes 18 and 22 on the upper surface of the chip 10 to provide the necessary electrical contact when the lid is positioned on top of the chip. The lid 30 may be bonded to tub 28 (FIG. 2) or chip 1 (FIG. 3) at the edges 40 thereof using known techniques.

Various techniques for bonding the foils 36 and 38 to the chip electrodes 18 and 22, and for bonding foils 36 and 38 to the lid 30, are known in the prior art and may be used in the present invention, including both solder bonds and direct solderless bonds such am compression bonding, ultrasonic bonding, thermosonic bonding, diffusion bonding, cold welding, resistance welding, laser welding and direct bonded copper.

The lid 30 may be a ceramic such as alumina, beryllium oxide or aluminum nitride. The foils 36 and 38 on the lid lower surface may be copper foils about 0.001 to 0.005 inches thick that may be direct bonded copper to the lid 30. Thicker foils may be used for higher conductivity, although thicker foils may increase stress on the chip and the package. Thinner foils reduce conductivity and may increase the risk of tearing or leaking. The foils 36 and 38 may be bonded to the electrodes 18 and 22 on the upper surface of the chip 10 by known methods including solder, thermocompression bonding and reaction gold-aluminum bonding. Solderless bonds are preferred in hermetic packaging to prevent the introduction of debris into the package 26 and to avoid inadvertent spread of the solder to other areas of the chip.

It is accordingly, an object of the present invention to provide a novel method of covering a cellular semiconductor chip with a lid having electrode contacts on a lid lower surface in which the lid-to-chip alignment tolerances are not dictated by the alignment of the lid carried gate contacts with the gate electrode.

It is a further object of the prevent invention to provide a novel method of packaging a cellular semiconductor chip in which the package has lid-carried contacts for the chip electrodes and in which interdigitated gate runners are used to reduce effective series resistance in the chip gate electrode even though the lid-to-chip alignment tolerances exceed the width of the gate runners.

It is yet a further object to the present invention to provide a novel semiconductor chip in which plural interdigitated gate runners are applied to the chip in the same process step as the source electrode for the chip and in which each gate runner has a widened area for bonding to a lid-carried foil contact.

These and many other objects and advantages will be readily apparent to one skilled in the art to which the invention pertains from a perusal of the claims, the amended drawings and the following detailed description of preferred embodiments.

THE DRAWINGS

FIG. 4 is a bottom plan view of a lid that may be used in the embodiments of FIGS. 2 and 3.

FIG. 5 is a top plan view of a chip that may be packaged using the present invention.

FIG. 6 is top plan view of a semiconductor chip of the present invention.

FIG. 7 is a bottom plan view of a lid that may be used with the embodiment of the present invention illustrated in FIG. 6.

DESCRIPTION OF PREFERRED EMBODIMENTS

Figure 1:
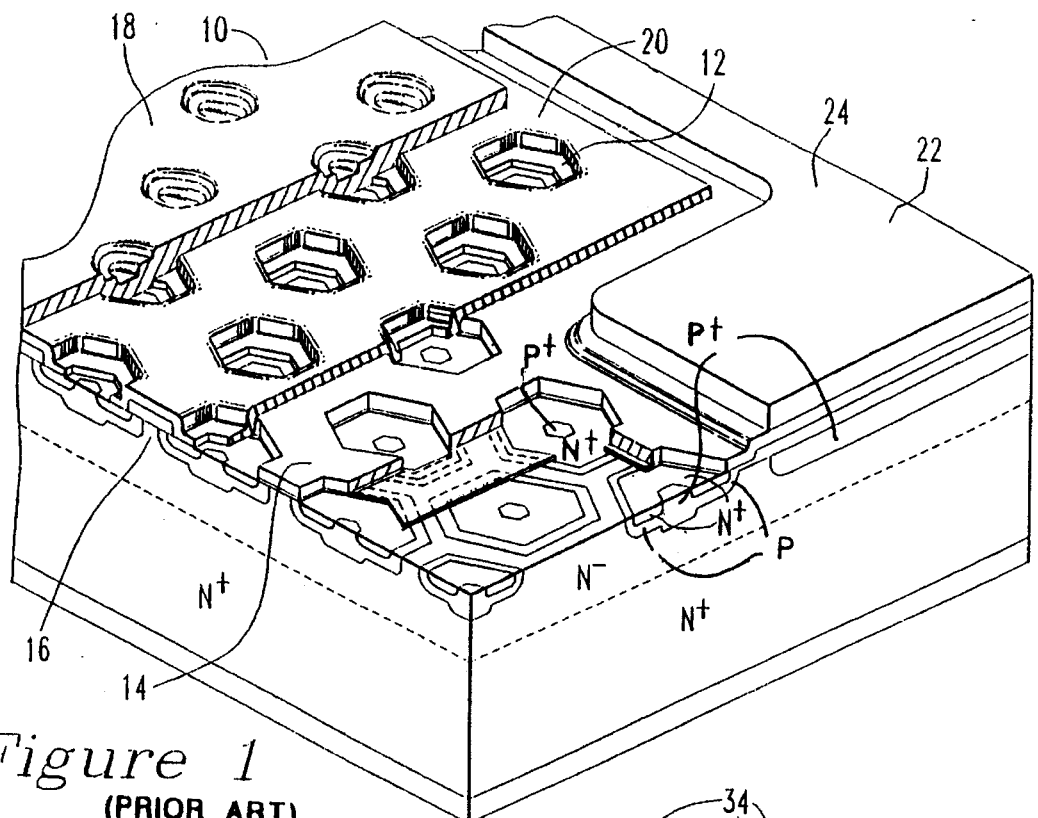
FIG. 1 is a pictorial depiction in partial cross-section of a portion of a semiconductor chip having a cellular topography of the prior art.

With reference now to FIG. 6 for a top plan view of a semiconductor chip 50 having a cellular topography, the present invention includes plural spaced-apart metal gate runners 52, each having a gate bonding pad 54 integral therewith. The gate runners 52 extend across the chip surface in the spaces between cells on the upper surface of chip 50 and are in contact with the chip gate electrodes therebeneath. Each of the gate bonding pads 54 has a width that is sufficient to allow a lid contact foil to be bonded thereto. The gate bonding pads 54 may displace some cells or may be located between cells where cell spacing permits, such as in the center of a square of four cells.

The surface of the chip also includes plural source electrode bonding pads 56 that may be integral with or contact the chip source electrode. The electrode bonding pads 56 overlie the chip cells and the intercellular spaces, but not the gate runners 52 or gate bonding pads 54.

The spacing of gate runners 52 is determined, at least in part, by a design tradeoff of voltage rise time $t_r$ (the time it takes for device current to rise from 0.1 to 0.9 of device saturation current) and the amount of device active area displaced by the gate bonding pads 54. Enough gate runners should be provided so that the desired rise time is achieved while achieving the desired device capability.

The voltage rise time is function of the resistance in the polysilicon gate and in the gate runners and may be calculated by considering the two resistance components separately. The voltage rise time of the polysilicon gate is determined by considering separately the areas between the runners and the areas at the distal ends of the runners. The rise time at a point half way from one of the gate runners 52 is:

$$t_{r,poly} = \frac{1}{8} d^2 \rho_{\square poly} C_o \tag{1}$$

where d is the inter-runner spacing in centimeters, $\rho_{\square}$poly is the polysilicon gate resistance in ohms/square, and $C_o$ is the capacitance of a 1 cm² gate. At the distal ends of the gate runners 52, the part of the polysilicon gate farthest from the gate runner has a voltage rise time of about:

$$t_{r,poly} = z^2 \rho_{\square,poly} C_o \tag{2}$$

where z is the distance from the end of the runner to the edge of the gate polysilicon. Equation (2) provides reasonable accuracy, although a computer solution may be preferable where better accuracy is required.

The rise time of the device is also influenced by the resistance in the gate runners 52 over the distance from their distal ends to the contact with the gate bonding pads 54. In the embodiment illustrated in FIG. 6, the rise time of the runners is approximately:

$$t_{r,R} = W^2 \rho_{\square,R} C_o / 8N \tag{3}$$

where W is the length of the devise active area in the direction of the gate runner longitudinal axis, $\rho_{\square},R$ is the sheet resistance of the gate runner and N is the number of runners per centimeter.

While FIG. 6 illustrates gate runners 52 that are parallel to an edge of the chip and to each other, other arrangements, such as diagonal, cross-hatch and the like, may also be used.

Factors such as cell spacing, cell pattern, bonding method, and chip performance considerations may lead one skilled in the art to another arrangement. The selection of the size and position of the source electrode bonding pads 56 will be influenced by the same factors and by the placement of the gate runners 52.

It will be appreciated by those skilled in the art that the present invention will find application in chips that have more than two electrodes on an upper surface thereof.

Figure 2:
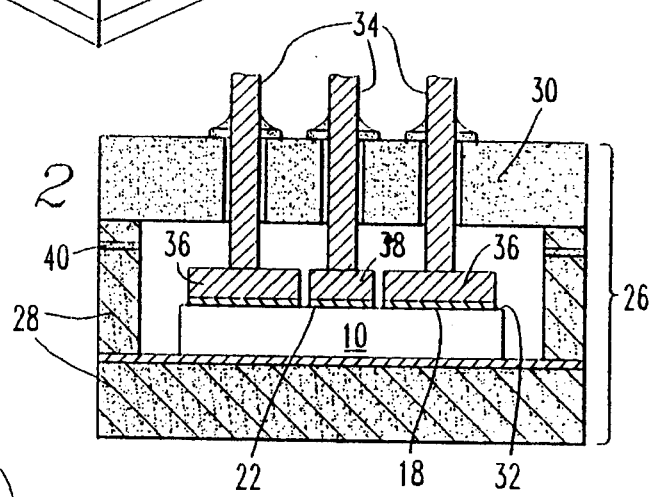
FIG. 2 is a vertical cross-section of a packaged chip of the prior art.
Figure 3:
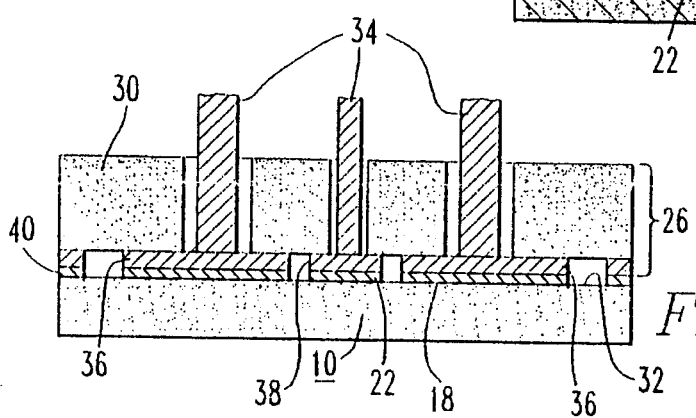
FIG. 3 is a vertical cross-section of another packaged chip of thee prior art.

With reference now to FIG. 7, a lid 58 for the chip 50 may include gate foil 60 for making electrical contact with the gate bonding pads 54 and one or more source electrode foils 62 for making electrical contact with time source electrode bonding pads 56. As in the prior art, foils 60 and 62 may be bonded to the lid 58 (as seen in FIG. 3) or separated therefrom (as seen in FIG. 2).

When the lid 58 is positioned on chip 50, the foil 60 makes electrical contact with the gate bonding pads 54 and the foils 62 make electrical contact with the source electrode bonding pads 56. As is apparent from FIGS. 6 and 7, the gate runners 52 will have segments 64 that underlie the Source electrode foils 62 when the lid 58 is in position. The gate runners 52 are electrically separated from the foils 62, desirably by a nonbondable dielectric material 66 that covers the segments 64 of the gate runners 52 that underlie the source electrode foils 62.

Figure 8:
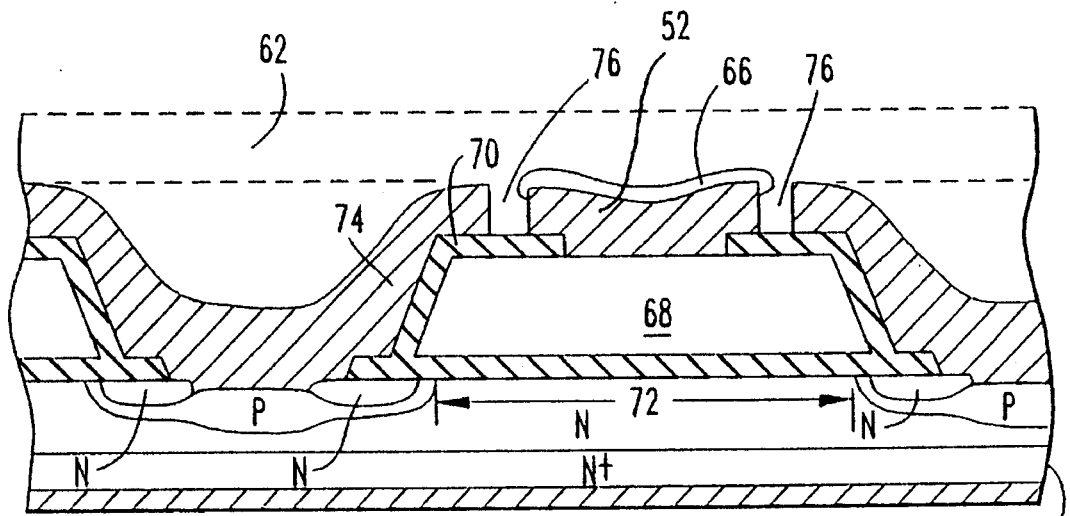
FIG. 8 is vertical cross section of a cellular semiconductor chip of the present invention through line 8—8 of FIG. 6.
Figure 9:
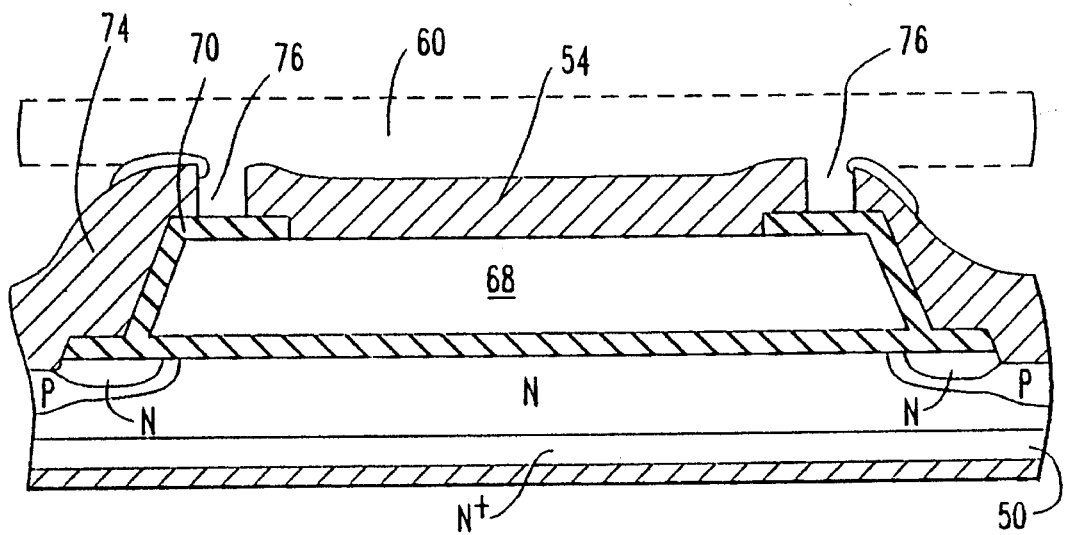
FIG. 9 is vertical cross section of a cellular semiconductor chip of the present invention through line 9—9 of FIG. 6.

The arrangement of the gate runners 52, bonding pads 54 and 56, and the source electrodes may be seen more clearly with reference to FIGS. 8 and 9 that are vertical cross sections of portions of the chip shown in FIG. 6. The types of cells and substrata illustrated in FIGS. 8 and 9 are examples merely showing one chip type of the many that may find the prevent invention applicable. As seen in FIG. 8 a gate runner 52 may overlie the chip 50 and contact the chip gate electrode 68 that has a portion of its insulative layer 70 removed to facilitate contact with the gate runner 52. The gate runner 52 may have a width of about 3 to 10 microns and cover nearly all or only a part of an intercellular space 72. Using techniques known in the art, the gate runner 52 may be deposited onto the chip in the same step and from the same metal material (e.g., aluminum) as the source electrode 74 and separated from the source electrode 74 by a valley 76 etched therebetween.

The dielectric material 66 may be deposited on the gate runner 52 in the portions that will underlie the source electrode foils 62. The dielectric material 66 may also be nonbondable to further assure separation of the gate runners from the lid-carried foil contacts. Acceptable nonbondable dielectric material include silicon dioxide, glass, nitride or combinations thereof.

As seem in FIG. 9, the gate electrode bonding pads 54 are formed in the same manner am the gate runners 52, but without the insulative, nonbondable material 66. The bonding pads 54 may be a narrow as 25 microns and as short as 25 microns and still be able to be bonded to the lid-carried foil contact. To the extent the intercellular spaces permit, the bonding pads 54 may be formed without displacing cells and without reducing the size of the chip active area.

The desired metalization of the gate runners and bonding pads and of the electrode bonding pads should be compatible with the lid bonding technique. For example, Al metalization should be used with reaction bonding, Al-Ti-Ni with solder, and Al-Ti-Ni-AU with thermal compression bonding.

As a result of these chip topography changes:

(a) chip performance may be improved by reducing ESR in the gate electrode;

(b) manufacturing costs may be reduced by easing lid-to-chip alignment tolerances; and (c) chip complexity is not increased by obviating the need for further metal and dielectric layers.

While preferred embodiments of the present invention have been described, it is to be understood that the embodiments described are illustrative only and that the present invention is to be define solely by the appended claims when accorded a full range of equivalence, many variations and modifications naturally occurring to those skilled in the art from a perusal hereof.

I claim:

1. A cellular semiconductor chip with a first electrode in intercellular spaces and a second electrode overlying the cells, both electrodes on a chip upper surface that is to be covered with a lid, the chip comprising:

plural runners overlying and contacting said first electrode in predetermined intercellular spaces, the plural runners being applied in the same processing step as the second electrode, each of the plural runners having a widened area where said runners may be bonded to the lid lower surface.

2. The chip of claim 1 further comprising a nonbondable dielectric material covering portions of each of said plural runners not in said widened area.

3. The chip of claim 1 further comprising contact pin apertures through said lid extending from an upper to a lower surface thereof.

4. The chip of claim 3 wherein said first and second electrodes are bonded to said lid lower surface to seal said apertures.

5. A semiconductor device comprising (a) a semiconductor chip having an active area and first and second electrodes on an upper surface thereof, (b) a lid for covering the upper surface of the chip, the lid having upper and lower surfaces and apertures extending therethrough between said lid upper and lower surfaces, (c) first and second metal foils adjacent said lid lower surface, and;

(d) at least one first bonding area wherein said first electrode is bonded to said first foil, and at least one second bonding area wherein said second electrode is bonded to said second foil, the surface area of said first bonding area not being available as an active area of said chip, said first electrode comprising:

plural first electrode runners having first segments extending between portions of said second electrode and beneath without contacting said second foil; and each of said first electrode runners having a second segment not beneath said second foil that forms said first bonding area that has a width sufficient to bond said first foil thereto.

6. The device of claim 5 further comprising a nonbondable dielectric material overlying maid first segments of maid first electrode runners.

7. The device of claim 5 wherein said first electrode runners are generally coplanar with said second electrode.

8. A packaged semiconductor device having a cellular semiconductor chip and a lid with electrical connections therethrough to a foil adjacent a lid lower surface for contacting the chip gate electrode, the chip comprising:

interdigitated gate runners for lowering the effective series resistance of the chip gate electrode;

plural gate bonding pads, one for each of said gate runners, each having a size sufficient to bond the foil thereto and being unrelated to the size of the electrical connections through the lid.

9. The package of claim 8 wherein said lid lower surface includes a second foil for contacting a second chip electrode and wherein said gate runners are under the second foil when the chip is covered by the lid, and further comprising an electrical insulator on said gate runners so they do not contact said second foil when said chip is covered by said lid.

10. The package of claim 8 wherein said chip has cells that are spaced 5 to 25 microns apart.

11. The package of claim 8 wherein said foil is bonded to each of said gate bonding pads using one of the bonding methods in the group consisting of soldering, thermocompression bonding and reaction gold-aluminum bonding.

12. In a semiconductor device having a plurality of spaced semiconductor MOS devices formed in a semiconductor substrate, each of the MOS devices having a first current conduction anode, or cathode, region and a gate located on the same side of the substrate, a connector arrangement on said side of the substrate for providing separate electrical connections to said first regions and the gates comprising:

a first plurality of elongated conductive elements formed on said side of the substrate positioned over separate groups of contacts to MOS devices, wherein each element makes electrical connections with each of the first conductive regions of its group of MOS devices, and defines a plurality of elongated contacts for making connection to the first conductive regions;

a second plurality of elongated conductive elements on said side of the substrate and positioned over contacts to separate groups of MOS devices and separated from said first plurality of elements wherein each of the second elements makes electrical connection with each of the gates of its group of MOS devices, said second elements being substantially narrower than the first conductive elements;

a plurality of conductive pads formed on said substrate surface at locations without MOS devices therein and separated from the first conductive elements wherein each one of the pads are connected to at least one of the second elements and wherein each of the pads defines a plurality of contacts for making connection to the gates, and an insulation layer extending over each of said first and second conductive elements wherein the first elements are exposed for making connections thereto.

* * * * *